(12) United States Patent
Wu

(10) Patent No.: US 6,653,159 B2
(45) Date of Patent: Nov. 25, 2003

(54) METHOD OF FABRICATING A THIN FILM TRANSISTOR LIQUID CRYSTAL DISPLAY

(75) Inventor: Mong-Yueh Wu, Hsin-Chu (JP)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/063,749

(22) Filed: May 10, 2002

(65) Prior Publication Data

US 2002/0168788 A1 Nov. 14, 2002

(30) Foreign Application Priority Data

May 11, 2001 (TW) ........................................ 90111352 A

(51) Int. Cl.[7] .............................................. H01L 21/00
(52) U.S. Cl. ....................................................... 438/30
(58) Field of Search ........................ 438/30, 48, 149, 438/155, 158; 257/72, 59, 250, 356; 349/41, 43, 46, 39

(56) References Cited

U.S. PATENT DOCUMENTS 6,022,753 A * 2/2000 Park et al. .................... 438/30

* cited by examiner

Primary Examiner—Dung A. Le
(74) Attorney, Agent, or Firm—Winston Hsu

(57) ABSTRACT

A thin film transistor liquid crystal display(TFT-LCD) is fabricated on a glass substrate. The glass substrate includes at least one transistor area and one cross over region. A gate electrode that passes through the cross over region is formed on the substrate. Then, a first isolation layer, a second isolation layer and a semiconductor layer are formed to cover the gate electrode and the scan line. Further, a doped silicon conductive layer is formed on the semiconductor layer and the etching stop layer. The portions of the doped silicon conductive layer, the semiconductor layer and the second isolation layer positioned (a) except the transistor area and (b) except the cross over region are removed. Following that, a transparent conductive layer is formed over the substrate, the transparent conductive layer is patterned to form at least one auxiliary signal line and at least one pixel electrode. A second metal layer is formed on the surface of the substrate to cover the transistor area. The doped silicon conductive layer, the semiconductor layer, the second isolation layer, and the first isolation layer are retained on the cross over region where the auxiliary signal line and the scan line simultaneously pass through.

15 Claims, 18 Drawing Sheets

METHOD OF FABRICATING A THIN FILM TRANSISTOR LIQUID CRYSTAL DISPLAY

BACKGROUND OF INVENTION

1. Field of the Invention

The present invention relates to a method of fabricating a thin film transistor liquid crystal display(TFT-LCD), and more particularly, to a method of fabricating a thin film transistor liquid crystal display to prevent the Mentsuki Effect.

2. Description of the Prior Art

Due to continued development and advancement in electrical technology, the range of application as well as the demand for flat panel displays is ever increasing. A liquid crystal display (LCD) is one type of flat panel display and is employed extensively in small-scale products, such as sphygmomanometer, to various portable electronic devices such as PDAs and notebooks, to such an extent as the commercial big panel display.

At present, the LCD device is primarily composed of a thin film transistor (TFT) with a matrix structure to drive liquid-crystal-pixels so as to generate color-rich graphics. The conventional TFT-LCD includes a transparent substrate having a matrix of thin film transistors, pixel electrodes, scan lines, signal lines, a color filter and liquid-crystal materials between the transparent substrate and the color filter. Since TFT-LCD has the advantages of lightweight, low energy consumption, and free of radiation emission, the TFT-LCD is extensively applied to informational products and has a great potential for the future.

Please refer to FIG. 1 of cross-sectional diagrams of fabricating a single TFT-LCD devicedevice 10 according to the prior art. The prior art technology utilizes the photo-etching-processes(PEP) seven times to form the TFT-LCD device 10 on a transparent glass substrate 11 of a twist-nematic(TN) TFT-LCD 10 system. Only the thin film transistor, the pixel electrode, the scan line, the signal line, the pad and a portion of crossing over of the scan line and the signal line are shown in FIG. 1.

As shown in FIG. 1A, the glass substrate 11 comprises at least one transistor area 210 for forming a thin film transistor (TFT), at least one pad area 220 for forming a pad electrode, and at least one cross over region 230 of scan lines and signal lines. In the prior art method, a first metal layer (not shown) is deposited on the surface of the glass substrate 11, then a first photo-etching-process(PEP-1) is performed to form a gate electrode 12 in the transistor area 210, a pad electrode 14 in the pad area 220, and a scan line 16 passing through the cross over region 230. The gate electrode 12 is connected to another scan line (not shown) on the surface of the glass substrate 11.

As shown in FIG. 1B, after the PEP-1, a first isolation layer 18, a second isolation layer 22, a semiconductor layer 24 and an etching stop layer (not shown) are deposited on the glass substrate 11. Then, a second photo-etching-process (PEP-2) is performed to form an etching stop layer 26 above the gate electrode 12, and other portions of the etching stop layer are totally removed. The semiconductor layer 24 is composed of polysilicon or amorphous silicon; the etching stop layer 26 is made of silicon nitride to prevent the semiconductor layer 24 from erosion in subsequent etching process.

As shown in FIG. 1C, a doped silicon conductive layer 28 is deposited on the semiconductor layer 24 and the etching stop layer 26. Then, a third photo-etching-process(PEP-3) is performed to pattern the doped silicon conductive layer 28, the semiconductor layer 24 and the second isolation layer 22 and remove the doped silicon conductive layer 28, the semiconductor layer 24 and the second isolation layer 22 positioned (a) except the transistor area 210 and (b) except the cross over region 230 for forming a signal line pattern to act as a bottom isolation layer of the subsequent signal line (not shown).

As shown in FIG. 1D, a transparent conductive layer (not shown) is formed on the doped silicon conductive layer 28 and the first isolation layer 18. Then, a fourth photo-etching-process(PEP-4) is performed for forming a transparent conductive layer 32 on the signal line pattern to act as an auxiliary signal line 32, and two pixel electrodes 34 are formed each side of the auxiliary signal line 32 on the first isolation layer 18.

As shown in FIG. 1E, a fifth photo-etching-process(PEP-5) is performed to form an opening in the first isolation layer 18 so as to expose the pad electrode 14 in the opening. Further, as shown in FIG. 1F, a second metal layer (not shown) is deposited over the glass substrate 11. Then, a sixth photo-etching-process(PEP-6) is performed to form a main signal line above the auxiliary signal line 32, and a pad signal line 39 in the pad area 220. The second metal layer 38 is electrically connected to the pixel electrode 34. Another etching process is performed to form an opening in the second metal layer 38 so as to expose the etching stop layer 26 in the opening, therefore, the thin film transistor(TFT) 42 is formed.

Finally, as shown in FIG. 1G, a passivation layer 44 is deposited over the glass substrate 11. Then, a seventh photo-etching-process(PEP-7) is performed to remove the passivation layer 44 positioned (a) above the opening of the pad area 220 and (b) on the surface of the pixel electrode 34, thus portions of the pad signal line 39 and the pixel electrode 34 are exposed.

In summary, the prior art method of fabricating a signal line 36 provides a glass substrate 11, followed by forming a first isolation layer 18 and a second isolation layer (not shown in FIG. 2) on the glass substrate 11. After some photo etching processes, a patterned semiconductor layer 24 and a patterned doped silicon conductive layer 28 are formed over the glass substrate 11 and a signal line is patterned. Afterwards, a transparent conductive layer 32 is patterned on the signal line pattern to act as an auxiliary signal line. Finally, a second metal layer 38 is formed on the transparent conductive layer 32 to act as a main signal line, and the overlapped main signal line and the auxiliary signal line form a signal line 36.

However as shown in FIG. 2, the semiconductor layer 24 and the doped silicon conductive layer 28 are patterned by a same photo mask, and the transparent conductive layer 32 and the second metal layer 38 are patterned by another photo mask. Therefore, after two photo-etching-processes, misalignments and etching errors will be formed. In one liquid crystal display with millions of pixels, this misalignment or overetching phenomena happened frequently. The distance between the signal line 36 and each side of the pixel electrode 34 is defined as δ0. Actually, after the etching process, the distances between the signal line 36 and each side of the pixel electrode 34 varies between δ1 and δ2 due to the misalignment of the process. When the main signal line 38 is formed in the subsequent process, the distances between the signal line 36 and each side of the pixel electrode 34 become δ3 and δ4 due to the misalignment of the PEP. These misalignment errors are shown in FIG. 3 of a top view diagram.

When the distances between the signal lines 36 and each side of the pixel electrodes 34 are unequal($\delta 3 \neq \delta 4$) or exceed a tolerance, the LCD panel would have a bright lines problem, namely the Mentsuki Effect. Therefore, it is important to avoid the problem mentioned above.

SUMMARY OF INVENTION

It is therefore an object of the present invention to provide a method of fabricating a thin film transistor liquid crystal display(TFT-LCD). The method is used to simplify the process and prevent the Mentsuki Effect of the thin film transistor liquid crystal display.

The present invention provides a method of fabricating a thin film transistor liquid crystal display(TFT-LCD). A TFT-LCD is fabricated on a substrate comprising at least one transistor area for forming a thin film transistor and at least one cross over region of a scan line and a signal line. First, a gate electrode in the transistor area and the scan line passing through the cross over region are formed on the substrate, and both are composed of a first metal layer. Then, a first isolation layer, a second isolation layer and a semiconductor layer are formed to cover the surface of the gate electrode and the scan line. An etching stop layer positioned above the gate electrode is formed on the semiconductor layer. Further, a doped silicon conductive layer is formed on the semiconductor layer and the etching stop layer. The doped silicon conductive layer, the semiconductor layer, and the second isolation layer positioned (a) except the transistor area and (b) except the cross over region are removed. Afterwards, a transparent conductive layer is formed over the substrate, then patterning the transparent conductive layer to form at least one auxiliary signal line passing through the cross over region and at least one pixel electrode on the surface of the substrate. A second metal layer is patterned to form a main signal line on the surface of the auxiliary signal line. An opening is formed in the second metal layer above the etching stop layer to expose the etching stop layer for forming the thin film transistor. The doped silicon conductive layer, the semiconductor layer, the second isolation layer and the first isolation layer are retained on the cross over region where the auxiliary signal line and the scan line pass through. The semiconductor layer, the doped silicon conductive layer and the second layer under the auxiliary signal line except the cross over region are entirely removed.

Since none of the doped silicon conductive layer and the semiconductor layer is formed under the signal line, the errors of the photo etching process are easily controlled. The distances between the signal line and each side of the pixel electrode are equal; therefore the Mentsuki Effect of the conventional liquid crystal display can be solved to prevent bright line defects. However, the second isolation layer, the semiconductor layer and the doped silicon conductive layer are retained in the cross over region to prevent the scan line, the bus signal line or the main signal line from shortening.

These and other objectives of the present invention will no doubt become obvious to those of ordinary skill in the art after having read the following detailed description of the preferred embodiment that is illustrated in the various figures and drawings.

DETAILED DESCRIPTION

Please refer to FIG. 4 of cross-sectional diagrams of fabricating a thin film transistor liquid crystal display(TFT-LCD) 100 according to the present invention. The present invention can be applied to the fabrication of a twist-nematic (TN) liquid crystal display. Only thin film transistors, pixel electrodes, scan lines, signal lines, pads and portions of a cross over region of the scan line and the signal line are shown in FIG. 4.

Figure 1A:
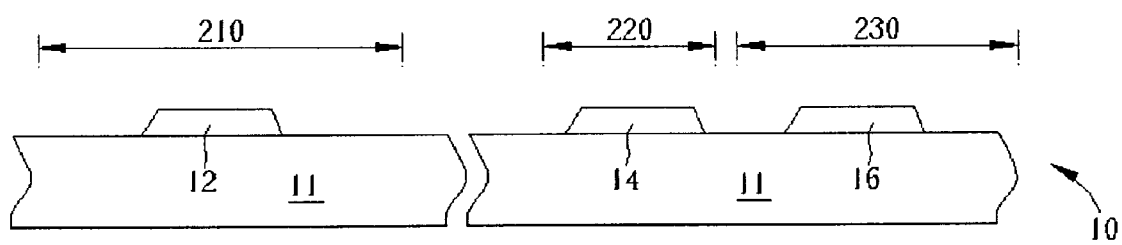
FIG. 1A to FIG. 1G are cross-sectional diagrams of fabricating a TFT-LCD system according to the prior art.
Figure 1B:
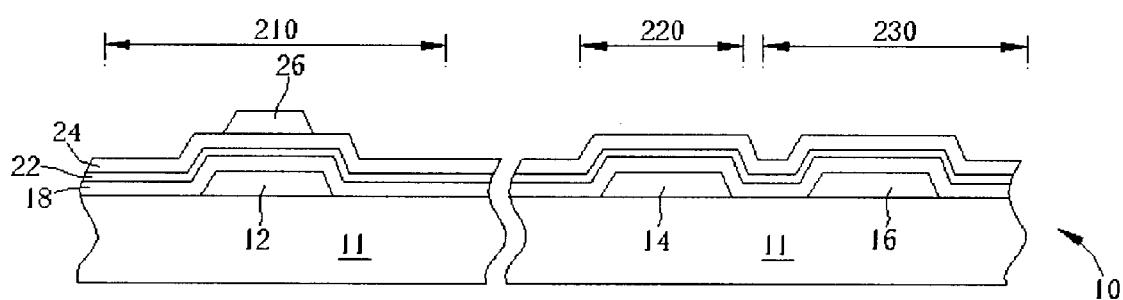
Figure 1C:
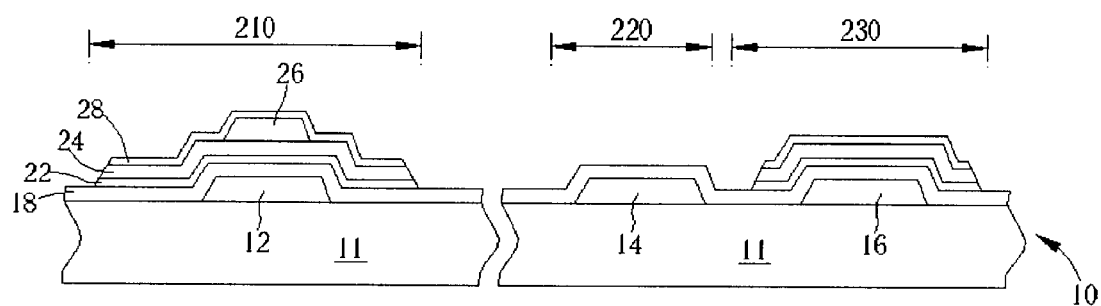
Figure 1D:
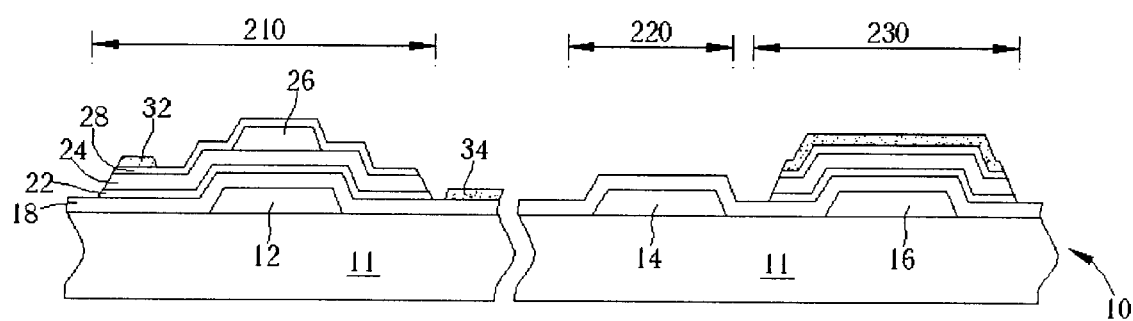
Figure 1E:
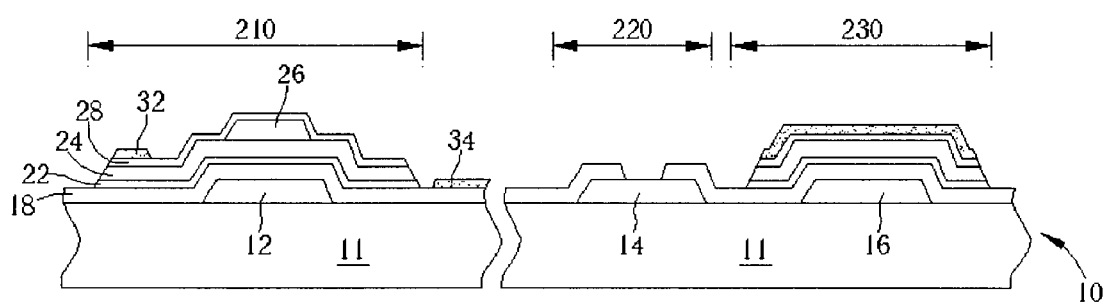
Figure 1F:
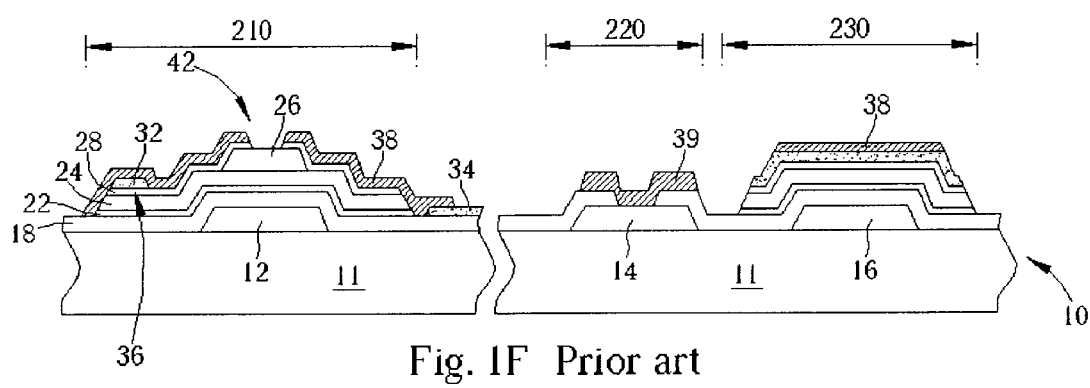
Figure 1G:
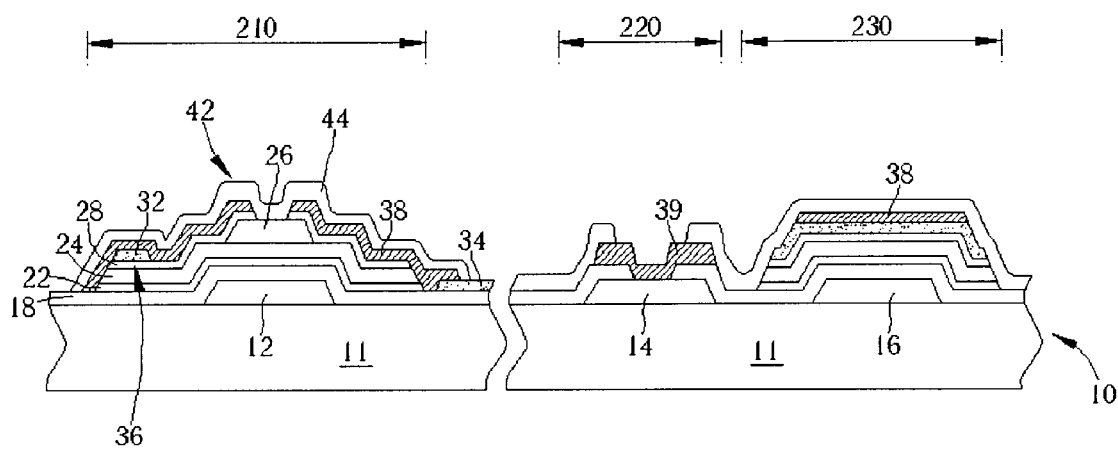
Figure 2:
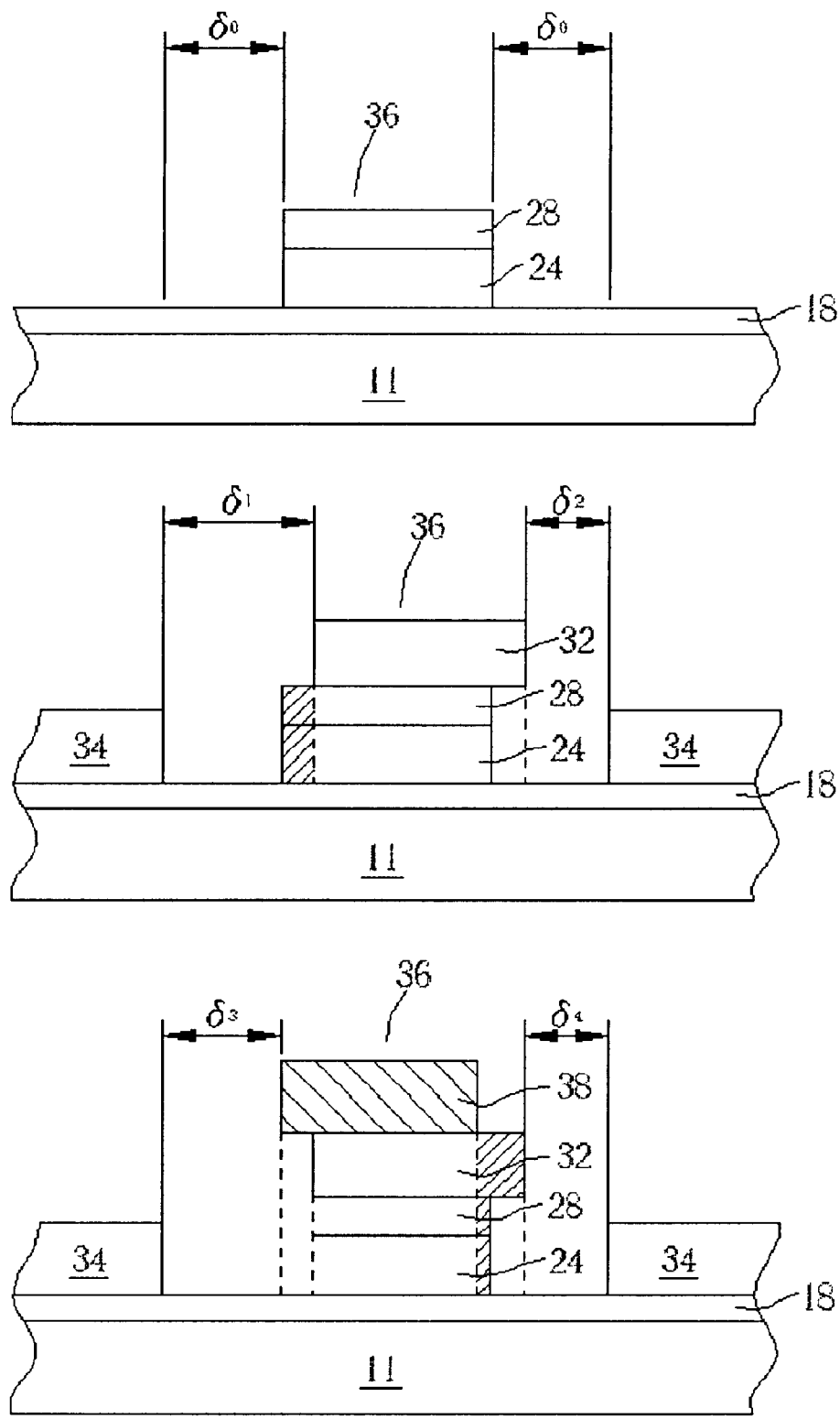
FIG. 2 is a cross-sectional diagram of a signal line and a pixel electrode of the TFT-LCD according to the prior art.
Figure 3:
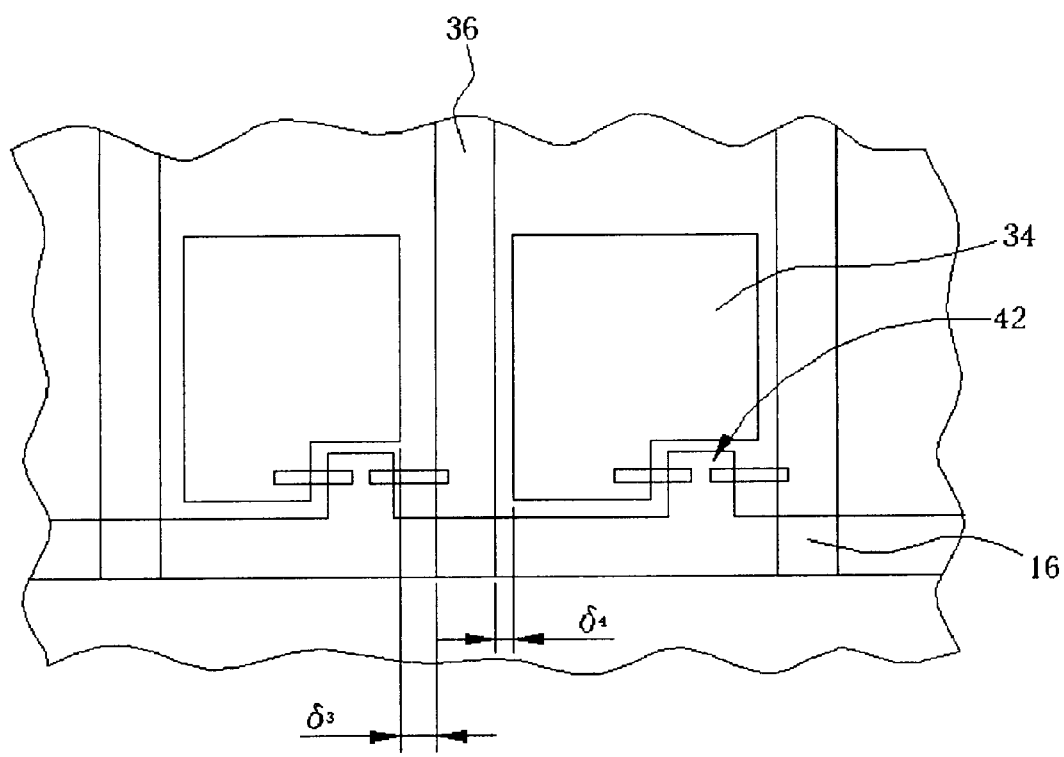
FIG. 3 is a top view of the signal line and the pixel electrode of the TFT-LCD shown in FIG. 1.
Figure 4A:
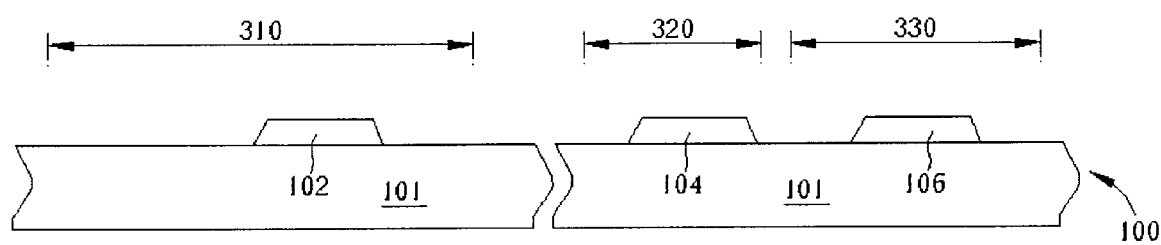
FIG. 4A to FIG. 4G are cross-sectional diagrams of fabricating a TFT-LCD system according to the present invention.

As shown in FIG. 4A, the glass substrate 101 includes at least one transistor area 310 for forming a thin film transistor (TFT), at least one pad area 320 for forming a pad, and at least one cross over region 330 of scan lines and signal lines. In the present invention, a first metal layer (not shown) is formed on the surface of the glass substrate 101, then patterning the first metal layer to form a gate electrode 102 in the transistor area 310, a pad electrode 104 in the pad area 320, and a scan line 106 passing through the cross over region 330. The gate electrode 102 is electrically connected to the scan line 106.

Figure 4B:
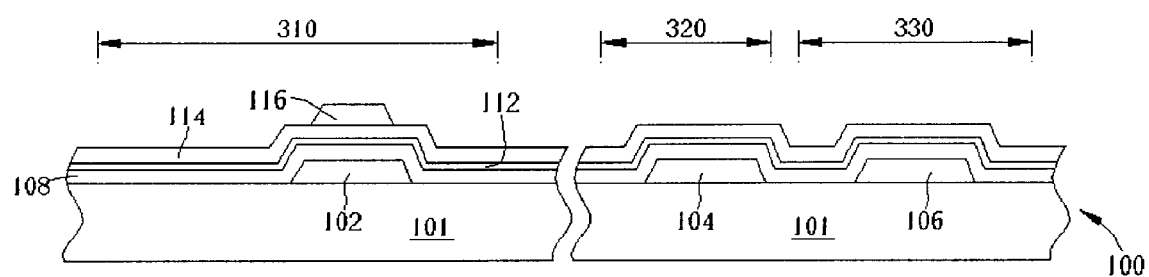

As shown in FIG. 4B, a first isolation layer 108, a second isolation layer 112 and a semiconductor layer 114 are deposited on the glass substrate 101, respectively. Then, an etching stop layer 116 is formed above the gate electrode 102. The semiconductor layer 114 is composed of polysilicon or amorphous silicon; the etching stop layer is made of silicon nitride to prevent the semiconductor layer 114 from erosion in the subsequent etching process; the first isolation layer 108 and the second isolation layer 112 are composed of silicon oxide ($SiO_x$) or silicon nitride ($SiN_y$).

Figure 4C:
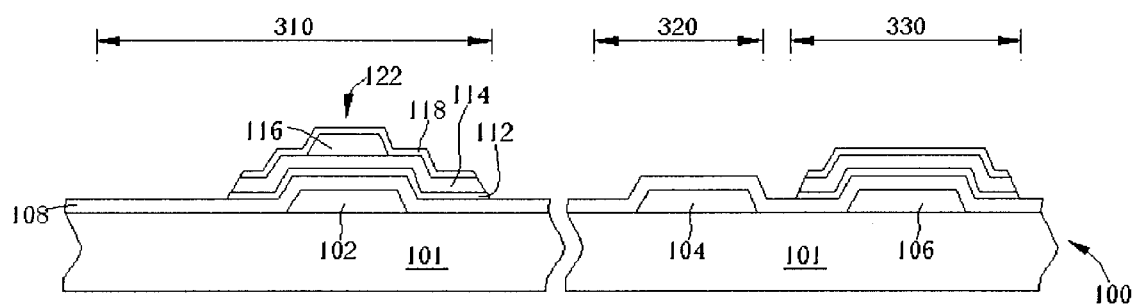

As shown in FIG. 4C, a doped silicon conductive layer 118 is deposited on the semiconductor layer 114 and the etching stop layer 116. Then, the doped silicon conductive layer 118, the semiconductor layer 114 and the second isolation layer 112 are patterned. The portions of the doped silicon conductive layer 118, the semiconductor layer 114 and the second isolation layer 112 positioned (a) except the transistor area 310 and (b) except the cross over region 330 are removed. That is, the semiconductor layer 114, the doped silicon conductive layer 118 and the second isolation layer 112 positioned within a predetermined region of the glass substrate 101 for forming a signal line (not shown) are totally removed. Simultaneously, the second isolation layer 112, the semiconductor layer 114 and the doped silicon conductive layer 118 above the pad electrode 104 are all removed.

Figure 4D:
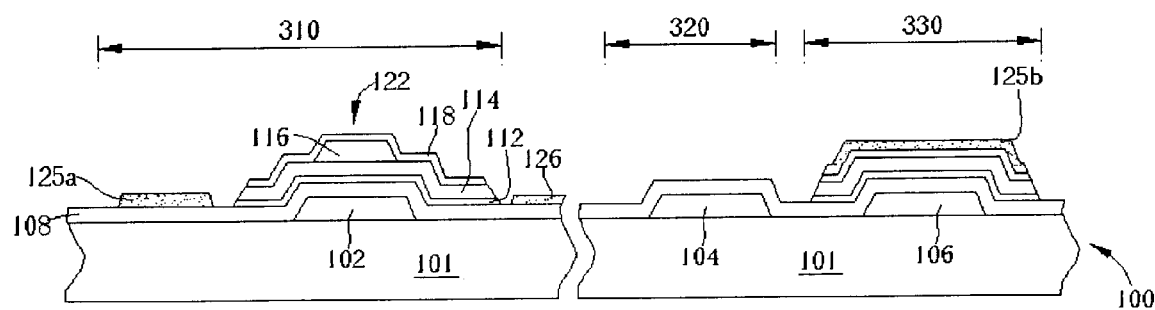

Further, as shown in FIG. 4D, a transparent conductive layer 124 is formed on the doped silicon conductive layer 118 and the first isolation layer 108. Then, the transparent conductive layer 124 is patterned to remove the transparent conductive layer 124 positioned except for the predetermined surface of the glass substrate 101, and remaining parts of the transparent conductive layer 124 are used as an auxiliary signal line. Simultaneously, a pixel electrode 126 is formed on each side of the predetermined surface of the glass substrate 101.

Figure 4E:
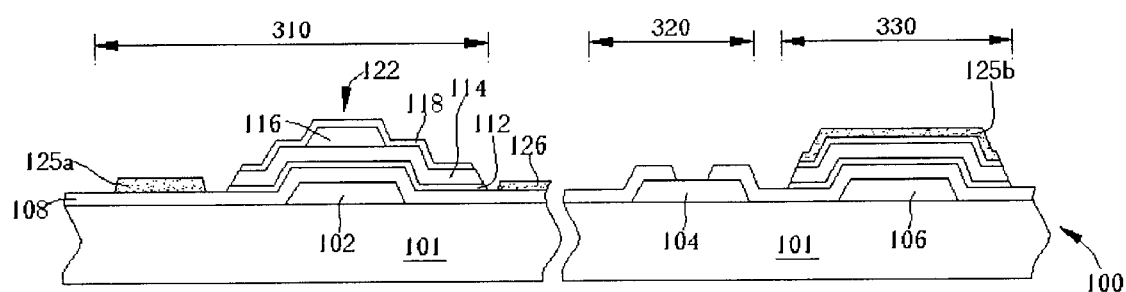
Figure 4F:
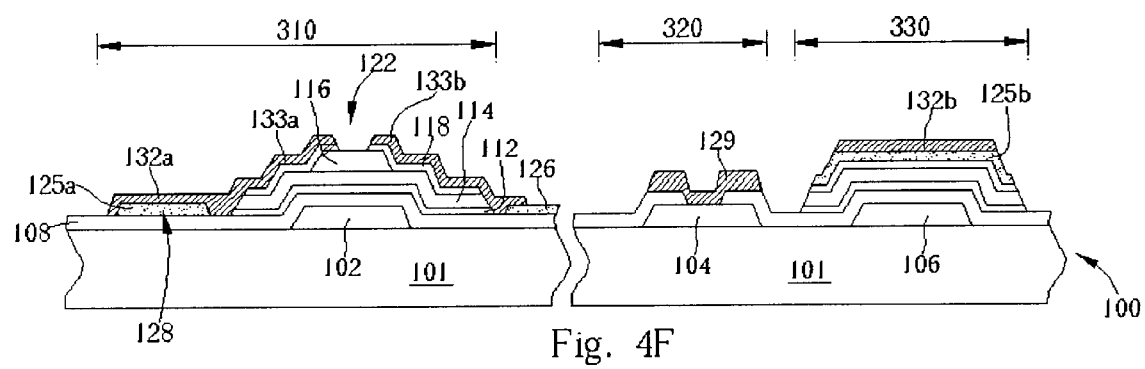

As shown in FIG. 4E, an opening is formed in the first isolation layer 108, thus the pad electrode 104 is exposed in the opening. Further, as shown in FIG. 4F, a second metal layer 132 is deposited over the glass substrate 11. The second metal layer 132 is patterned to form a main signal line 132a above the auxiliary signal line 125a, another main signal line 132b above the auxiliary signal line 125b, and a pad signal line 129 of the pad area 320. The second metal layer 132 is electrically connected to the pixel electrode 126. Then, another opening is formed in the second metal layer 132 to expose the etching stop layer 116 therein, so as to form a source 133a and a drain 133b, and the fabrication of the thin film transistor(TFT) 122 is completed. The overlapped main signal line 132a and the auxiliary signal line 125a form a signal line 128.

Figure 4G:
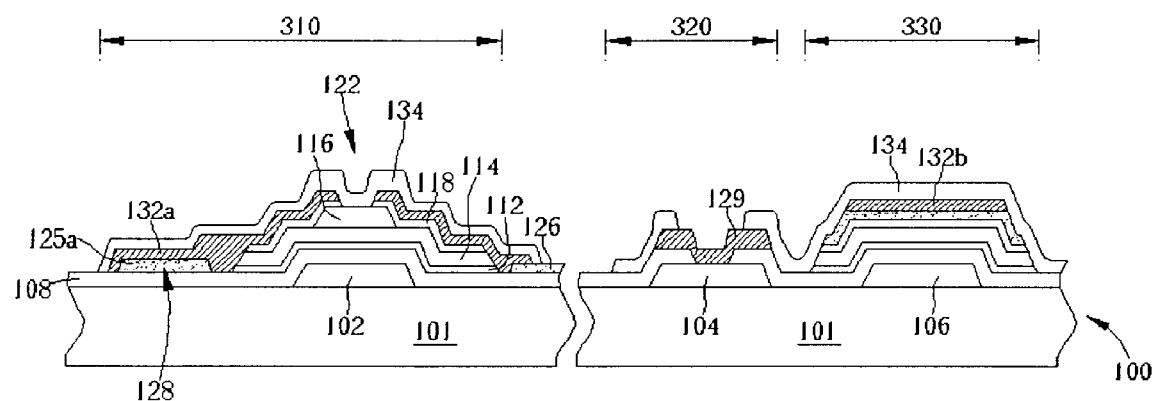

Finally, as shown in FIG. 4G, a passivation layer 134 is deposited over the transparent substrate 101. Portions of the passivation layer 134 positioned (a) above the opening of the pad area 320 and (b) on the surface of the pixel electrode 124 are removed to expose portions of the pad signal line 129 and the pixel electrode 126. Therefore, the signal line 128, the TFT 122, and the second metal layer 132 are connected to the pixel electrode 126. The whole cross over region 330 is covered by the passivation layer 134.

Figure 5:
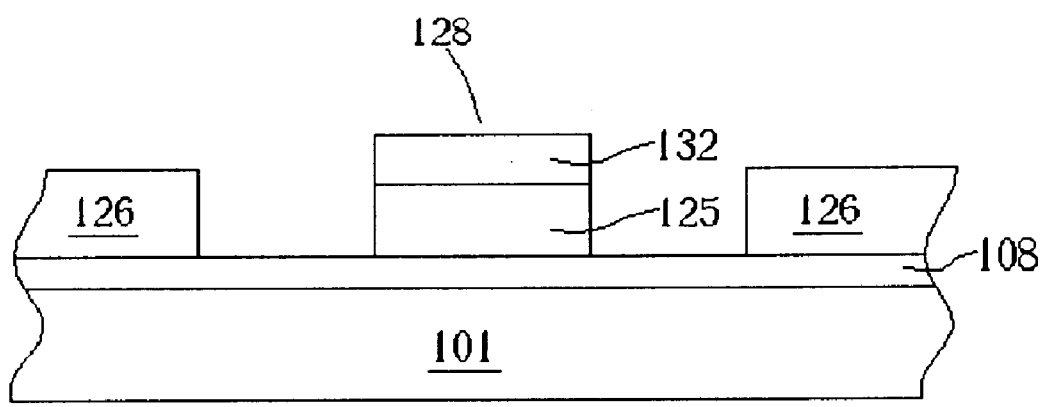
FIG. 5 is a cross-sectional diagram on finishing the fabrication of a signal line and a pixel electrode shown in FIG. 4.

In comparison with the prior art method of fabricating the signal line, the doped silicon conductive layer 118, the semiconductor layer 114 and the second isolation layer 112 positioned at the bottom of the signal line 128 are removed in the present invention. Therefore, the transparent conductive layer 125 that acts as the auxiliary signal line is directly formed on the predetermined surface of the first isolation layer 108. In other words, the signal line 128 only includes the auxiliary signal line 125 and the main signal line 132, as shown in FIG. 5.

Figure 6:
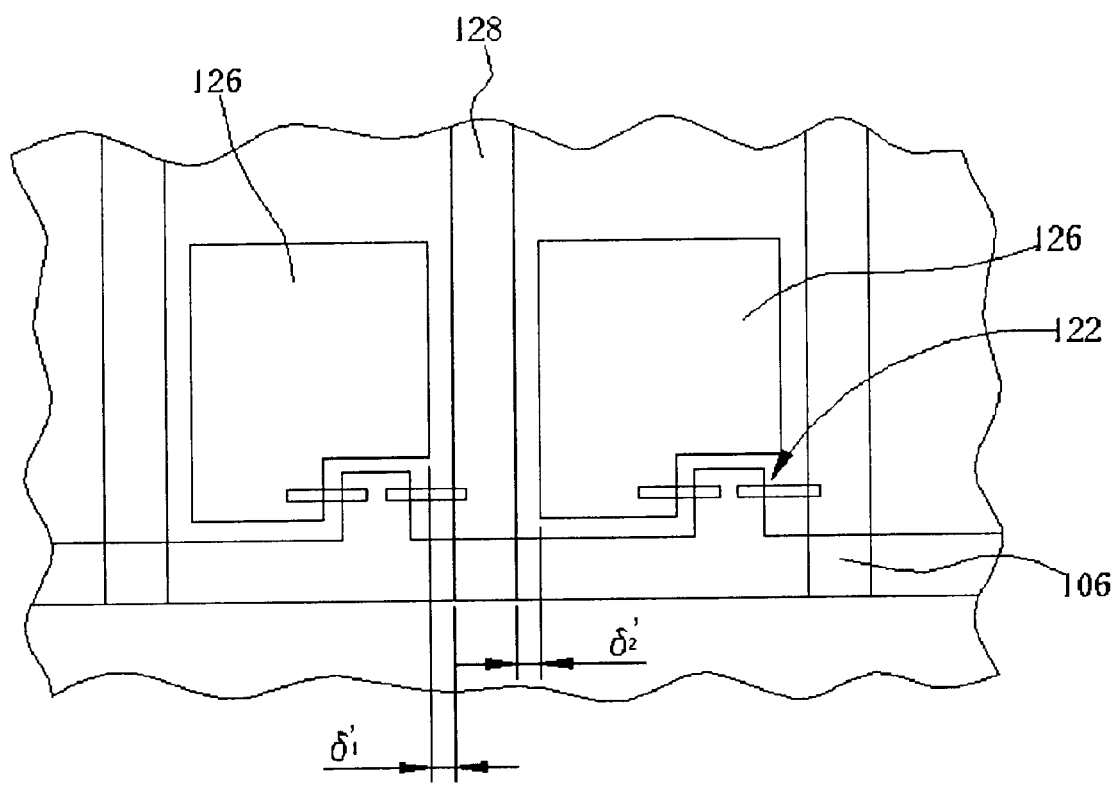
FIG. 6 is a top view of the signal line and the pixel electrode of the TFT-LCD shown in FIG. 4.

Since none of the doped silicon conductive layer 118 and the semiconductor layer 114 is formed under the signal line 128, the errors of the photo etching process are easily controlled. Please refer to FIG. 6, a top view of the signal line 128 and the pixel electrode 126 according to the present invention, the distances between the signal line 128 and each side of the pixel electrode 126 are δ'1 and δ'2. At present, δ'1=δ"2, therefore the Mentsuki Effect is eliminated to avoid bright line defects. The second isolation layer 112, the semiconductor layer 114 and the doped silicon conductive layer 118 are still retained in the cross over region 30 to prevent short circuits happening between the scan line 106, the auxiliary signal line 125, or the main signal line 132.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a thin film transistor liquid crystal display, the display being fabricated on a substrate, and the substrate comprising at least one transistor area for forming a thin film transistor (TFT) and at least one cross over region, the method comprising the step of:

forming a first metal layer on the substrate;
patterning the first metal layer for forming a gate electrode in the transistor area and a scan line passing through the cross over region of the substrate;
depositing a first isolation layer, a second isolation layer and a semiconductor layer on the substrate to cover the gate electrode and the scan line;
forming an etching stop layer on the semiconductor layer, the etching stop layer being positioned above the gate electrode;
depositing a doped silicon conductive layer on the semiconductor layer and the etching stop layer;
patterning the doped silicon conductive layer, the semiconductor layer and the second isolation layer to remove parts of the doped conductive silicon layer, the semiconductor layer and the second isolation layer positioned (a) except the transistor area and (b) except the cross over region;
forming a transparent conductive layer on the substrate;
patterning the transparent conductive layer to form at least one auxiliary signal line passing through the transistor area and one pixel electrode, and the auxiliary signal line passing through the cross over region;
forming a second metal layer on the substrate;
patterning the second metal layer to form a main signal line above the auxiliary signal line, to cover the transistor area and electrically connect to the pixel electrode, and an opening being formed in the second metal layer above the etching stop layer to expose the etching stop layer therein;
forming a passivation layer on the substrate; and
patterning the passivation layer by removing a part of the passivation layer positioned above the pixel electrode in order to expose the pixel electrode;
wherein the doped silicon conductive layer, the semiconductor layer, the second isolation layer, and the first isolation layer are positioned between the auxiliary signal line and the scan line in the cross over region, the main signal line and the auxiliary signal line are overlapped to compose a signal line, and none of the semiconductor layer, the doped silicon conductive layer and the second isolation layer is remained under the auxiliary signal line outside the cross over region.

2. The method of claim 1 wherein the doped silicon layer, the second isolation layer, and the first isolation layer in the cross over region are used to prevent the scan line and the signal line from short circuiting.

3. The method of claim 1 wherein the gate electrode is electrically connected to the scan line.

4. The method of claim 1 wherein the first isolation layer and the second isolation layer are composed of silicon oxide ($SiO_x$).

5. The method of claim 1 wherein the first isolation layer and the second isolation layer are composed of silicon nitride ($SiN_y$).

6. The method of claim 1 wherein the semiconductor layer is selected from a group consisted of polysilicon and amorphous silicon.

7. The method of claim 1 wherein the etching stop layer is made of silicon nitride.

8. The method of claim 1 wherein the transparent conductive layer is made of indium tin oxide (ITO).

9. A method of fabricating a thin film transistor liquid crystal display, the display being fabricated on a substrate, and the substrate comprising at least one transistor area for forming a thin film transistor (TFT) and at least one cross over region, the method comprising the step of:

forming a first metal layer on the substrate;
patterning the first metal layer for forming a gate electrode in the transistor area and a scan line passing through the cross over region of the substrate;

depositing a first isolation layer, a second isolation layer and a semiconductor layer on the substrate to cover the gate electrode and the scan line;

forming an etching stop layer on the semiconductor layer, the etching stop layer being positioned above the gate electrode;

depositing a doped silicon conductive layer on the semiconductor layer and the etching stop layer;

patterning the doped silicon conductive layer, the semiconductor layer and the second isolation layer to remove parts of the doped conductive silicon layer, the semiconductor layer and the second isolation layer positioned (a) except the transistor area and (b) except the cross over region;

forming a transparent conductive layer on the substrate;

patterning the transparent conductive layer to form at least one auxiliary signal line passing through the transistor area and one pixel electrode, and the auxiliary signal line passing through the cross over region;

forming a second metal layer on the substrate;

patterning the second metal layer to form a main signal line above the auxiliary signal line, to cover the transistor area and electrically connect to the pixel electrode, and an opening being formed in the second metal layer above the etching stop layer to expose the etching stop layer therein;

forming a passivation layer on the substrate; and patterning the passivation layer by removing a part of the passivation layer positioned above the pixel electrode in order to expose the pixel electrode;

wherein the doped silicon conductive layer, the semiconductor layer, the second isolation layer, and the first isolation layer are positioned between the auxiliary signal line and the scan line in the cross over region, the main signal line and the auxiliary signal line are overlapped to compose a signal line, none of the semiconductor layer, the doped silicon conductive layer and the second isolation layer is remained under the auxiliary signal line outside the cross over region, and the doped silicon conductive layer, the semiconductor layer, the second isolation layer, and the first isolation layer in the cross over region are used to prevent the scan line and the signal line from short circuiting.

10. The method of claim 9 wherein the gate electrode is electrically connected to the scan line.

11. The method of claim 9 wherein the first isolation layer and the second isolation layer are composed of silicon oxide ($SiO_x$).

12. The method of claim 9 wherein the first isolation layer and the second isolation layer are composed of silicon nitride ($SiN_y$).

13. The method of claim 9 wherein the semiconductor layer is selected from a group consisted of polysilicon and amorphous silicon.

14. The method of claim 9 wherein the etching stop layer is made of silicon nitride.

15. The method of claim 9 wherein the transparent conductive layer is made of indium tin oxide (ITO).

* * * * *